United States Patent
Park et al.

(10) Patent No.: US 7,193,926 B2
(45) Date of Patent: Mar. 20, 2007

(54) MEMORY DEVICE FOR REDUCING LEAKAGE CURRENT

(75) Inventors: Sang Il Park, Kyoungki-do (KR); Sang Kwon Lee, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 20 days.

(21) Appl. No.: 11/158,492

(22) Filed: Jun. 22, 2005

(65) Prior Publication Data

US 2005/0286335 A1    Dec. 29, 2005

(30) Foreign Application Priority Data

Jun. 23, 2004  (KR) .................. 10-2004-0047266

(51) Int. Cl.
*G11C 8/00*    (2006.01)
(52) U.S. Cl. .................. 365/230.06; 365/230.03; 365/189.05
(58) Field of Classification Search ......... 365/230.06, 365/230.03, 230.08, 189.05, 185.11, 185.23
See application file for complete search history.

(56) References Cited

U.S. PATENT DOCUMENTS

| | | | | |
|---|---|---|---|---|
| 6,104,645 A | * | 8/2000 | Ong et al. | 365/200 |
| 6,128,230 A | * | 10/2000 | Amanai | 365/185.23 |
| 6,198,685 B1 | * | 3/2001 | Sudo et al. | 365/230.06 |

* cited by examiner

*Primary Examiner*—Gene N Auduong
(74) *Attorney, Agent, or Firm*—Ladas & Parry LLP

(57) ABSTRACT

Disclosed is a memory device for reducing leakage current generated by a bridge between a word line and a bit line when the memory device is in a waiting mode. The memory device includes: N memory cell blocks each of which includes plurality of memory cell blocks, wherein N represents a natural number; (N+1) sense amp blocks corresponding to the N memory cell blocks; 2N switching blocks connecting the N memory cell blocks to the (N+1) sense amp blocks, respectively; and N controllers for controlling the 2N switching blocks, respectively, wherein the N controllers turn off the 2N switching blocks when the memory device is in a waiting mode, and the N controllers selectively turn on the 2N switching blocks when the memory device is in an operation mode.

5 Claims, 2 Drawing Sheets

MEMORY DEVICE FOR REDUCING LEAKAGE CURRENT

BACKGROUND OF THE INVENTION

1. Field of the Invention

The present invention relates to a memory device for reducing leakage current, and more particularly to a memory device for reducing leakage current generated by a bridge between a word line and a bit line when the memory device is in a waiting mode.

2. Description of the Prior Art

With the high integration of a memory device, the space of a memory cell is reduced and the size of a pattern is also reduced according to the reduction. Therefore, the occurrence probability of a bridge may also increase between a word line and a bit line. A memory device typically includes a redundant cell and a bad memory cell generated by a bridge between a word line and a bit line, etc., is replaced with the redundant cell through a redundant operation. However, even though the bad memory cell generated by the bridge between the word line and the bit line is replaced with the redundant cell, leakage current may flow by the bridge between the word line and the bit line in a waiting mode of a memory device. Therefore, power may be consumed.

FIG. 1 is a circuit diagram illustrating one example of a case where a bridge is formed between a word line and a bit line in a conventional memory device.

As shown in FIG. 1, the memory device includes memory cell blocks 111 to 114, sense amp blocks 121 to 125, switching blocks 141 to 148, and controllers 171 to 174.

Hereinafter, cases where the memory device is in an operation mode and a waiting mode will be separately described.

When the memory device is in the operation mode, in order to designate matrix type memory cells, row addresses and column addresses are applied to the memory cells through word lines WL1 to WL4 and bit lines BL1, /BL1, BL2, /BL2, BL3, /BL3, BL4, and /BL4. Simultaneously, an enable signal ACT is applied to the controller 171 to 174. Then, the controller 171 applies a control signal BIS1 to the switching blocks 141 and 142, the controller 172 applies a control signal BIS2 to the switching blocks 143 and 144, the controller 173 applies a control signal BIS3 to the switching blocks 145 and 146, and the controller 174 applies a control signal BIS4 to the switching blocks 147 and 148. For example, when one memory cell block 112 is selected from the four memory cell blocks 111 to 114, only the control signal BIS2 comes into a low level from among the four control signals BIS1, BIS2, BIS3 and BIS4. Therefore, only two switching blocks 142 and 145 are turned off from among the eight switching blocks 141 to 148. As a result, the sense amp blocks 122 and 123 are connected to the memory cell block 112 to be selected. The sense amps 128 and 129 of the connected sense amp block 122 and the sense amps 130 and 131 of the connected sense amp block 123 detect data of the memory cells in the memory cell block 112, respectively. Specifically, the sense amp block described in FIGS. 1 and 2 includes an equalizer for precharging corresponding pairs of bit lines with precharge voltage. As known in the art, an equalizer is a circuit for precharging pairs of bit lines with precharge voltage (e.g., Vdd/2) in a precharge mode.

When the memory device is in the waiting mode, each of the word lines WL1 to WL4 maintains a ground level, i.e., a Vss level, and each of the bit lines BL1, /BL1, BL2, /BL2, BL3, /BL3, BL4, and /BL4 maintains a Vcc/2 level. The controller 171 applies the control signal BIS1 of a high level to the switching blocks 141 and 142 by the enable signal ACT, the controller 172 applies the control signal BIS2 of a high level to the switching blocks 143 and 144 by the enable signal ACT, the controller 173 applies the control signal BIS3 of a high level to the switching blocks 145 and 146 by the enable signal ACT, and the controller 174 applies the control signal BIS4 of a high level to the switching blocks 147 and 148 by the enable signal ACT. Therefore, all of the switching blocks 141 to 148 are turned on. That is, the memory cell block 111 is connected to the sense amp blocks 121 and 122, the memory cell block 112 is connected to the sense amp blocks 122 and 123, the memory cell block 113 is connected to the sense amp blocks 123 and 124, and the memory cell block 114 is connected to the sense amp blocks 124 and 125. Herein, because the bit line is maintained with the precharge voltage, leakage current is continuously generated from the bit line to the word line having the ground voltage through a defective cell transistor. That is, when a bridge 181 is formed between the word line WL2 and the bit line BL3, the leakage current flows from the bit line to the word line by voltage difference between the word line and the bit line because the switching block 144 is in the turn-on state.

The leakage current flows when the memory device is in the waiting mode, thereby consuming power. Specifically, this power consumption may be largely problematic in recent memory devices pursuing low power consumption.

SUMMARY OF THE INVENTION

Accordingly, the present invention has been made to solve the above-mentioned problems occurring in the prior art, and an object of the present invention is to provide a memory device which can reduce power consumption by blocking leakage current in a waiting mode through improvement of a connection relation between a switching block and a controller.

In order to achieve the above objects, according to one aspect of the present invention, there is provided a memory device for reducing leakage current, the memory device including: N memory cell blocks each of which includes plurality of memory cell blocks, wherein N represents a natural number; (N+1) sense amp blocks corresponding to the N memory cell blocks; 2N switching blocks connecting the N memory cell blocks to the (N+1) sense amp blocks, respectively; and N controllers for controlling the 2N switching blocks, respectively, Wherein the N controllers turn off the 2N switching blocks when the memory device is in a waiting mode, and the N controllers selectively turn on the 2N switching blocks when the memory device is in an operation mode.

In the present invention, wherein N word lines connect the memory cells with each other, the N word lines corresponding to the N memory cell blocks respectively, bit lines corresponding to the memory cells connect the N memory cell blocks, the 2N switching blocks and the (N+1) sense amp blocks with each other, and a random $i^{th}$ controller of the N controllers is connected to a $(2i-1)^{th}$ switching block and a $2i^{th}$ switching block of the 2N switching blocks, wherein i represents a constant having a value of 1, 2, ..., N.

In the present invention, both a $(2k-1)^{th}$ switching block and a $2k^{th}$ switching block of the 2N switching blocks are turned on by an $k^{th}$ controller of the N controllers when the memory device is in an operation mode for selecting an $k^{th}$ memory cell block of the N memory cell blocks, wherein k represents a constant having a value of 1, 2, ..., N.

In order to achieve the above objects, according to another aspect of the present invention, there is provided a memory device having a folded bit line structure, the memory device including: N memory cell blocks; and a first switching block, a sense amp block and a second switching block disposed every between the memory cell blocks, wherein the first switching block is located between an $i^{th}$ memory cell block and the sense amp block, the second switching block is located between an $(i-1)^{th}$ memory cell block and the sense amp block, the first switching block and the second switching block are turned off when the memory device is in a waiting mode, and only the first switching block adjacent to the $i^{th}$ memory cell block is turned on when the memory device is in an operation mode.

In the present invention, bit lines of the memory cell block maintain ground voltage.

BRIEF DESCRIPTION OF THE DRAWINGS

The above and other objects, features and advantages of the present invention will be more apparent from the following detailed description taken in conjunction with the accompanying drawings, in which.

DETAILED DESCRIPTION OF THE PREFERRED EMBODIMENTS

Hereinafter, a preferred embodiment of the present invention will be described with reference to the accompanying drawings.

Figure 1:
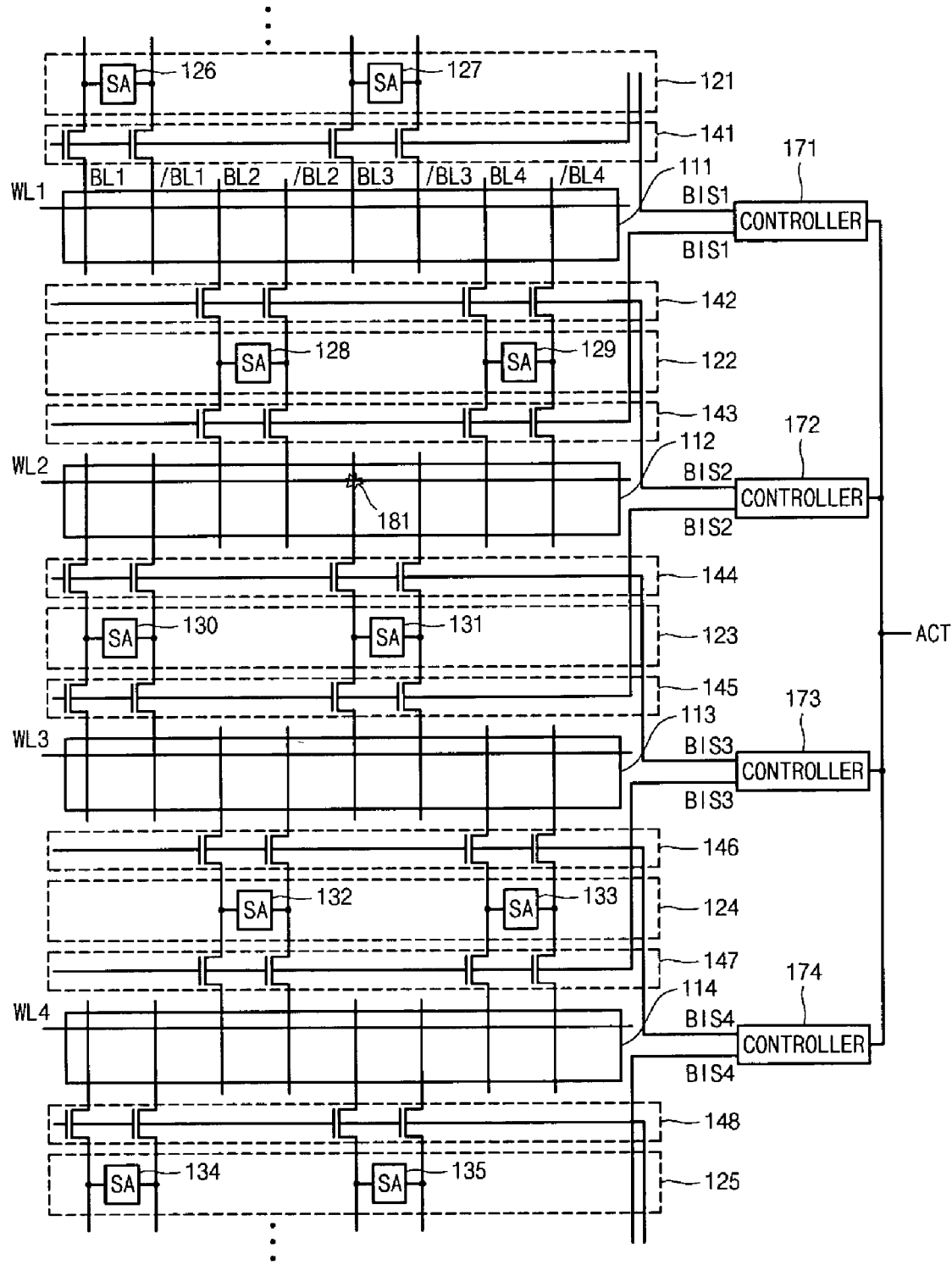
FIG. 1 is a circuit diagram of a conventional memory device.
Figure 2:
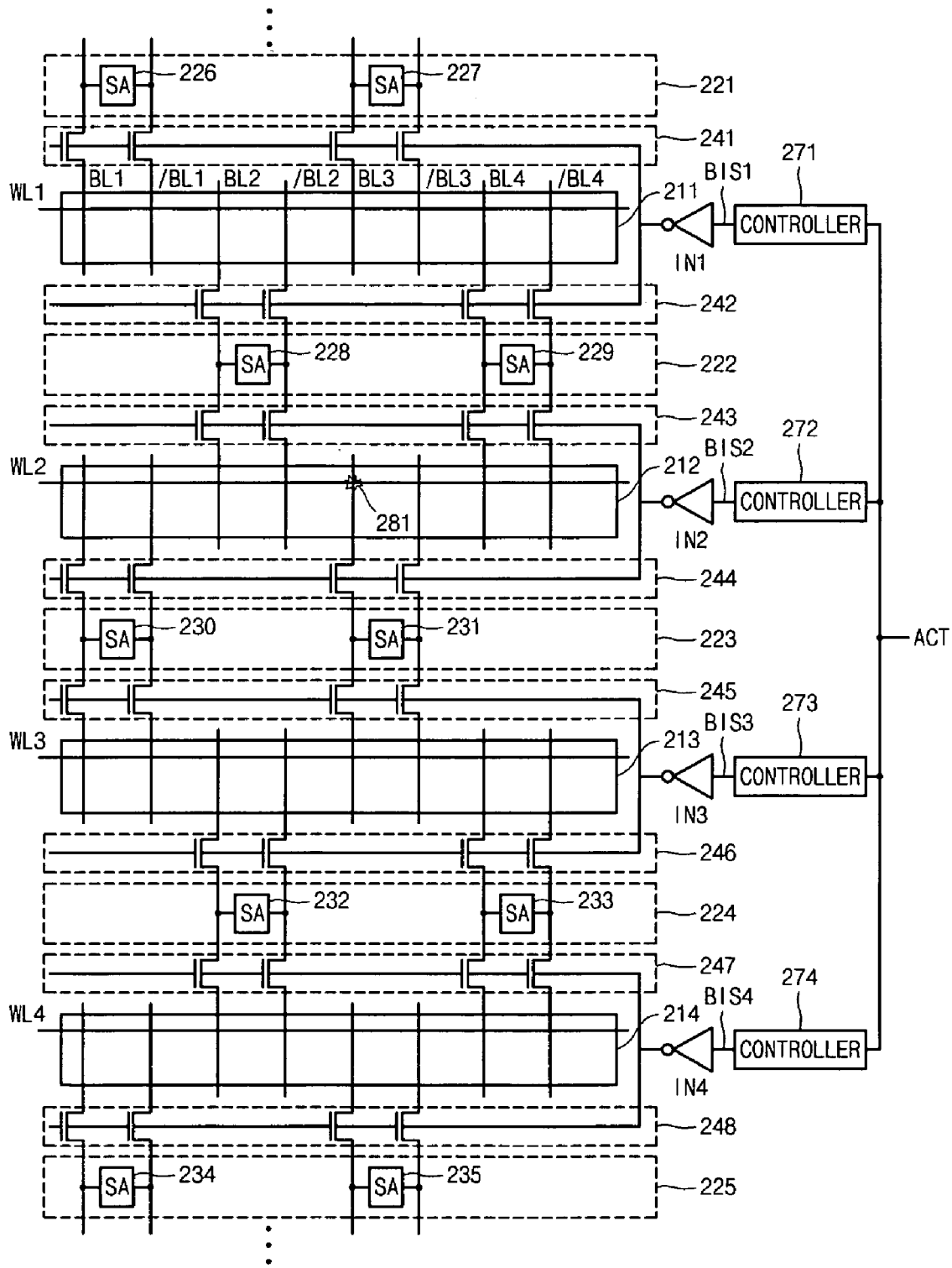
FIG. 2 is a circuit diagram of a memory device according to the present invention.

FIG. 2 is a circuit diagram of a memory device for reducing leakage current according to the present invention. FIG. 2 shows a part of a memory cell array having a folded bit line structure.

As shown in FIG. 2, the memory device includes memory cell blocks 211 to 214, sense amp blocks 221 to 225, switching blocks 241 to 248, and controllers 271 to 274.

Each of the memory cell blocks 211 to 214 includes a plurality of memory cells and the memory cells are connected by a corresponding word line WL1 or WL4.

When the memory device is in an operation mode, the sense amp block 221 detects data of the memory cells through sense amps 226 and 227 therein, the sense amp block 222 detects data of the memory cells through sense amps 228 and 229 therein, the sense amp block 223 detects data of the memory cells through sense amps 230 and 231 therein, the sense amp block 224 detects data of the memory cells through sense amps 232 and 233 therein, and the sense amp block 225 detects data of the memory cells through sense amps 234 and 235 therein.

The switching block 241 connects the memory cell block 211 with the sense amp block 221, the switching block 242 connects the memory cell block 211 with the sense amp block 222, the switching block 243 connects the memory cell block 212 with the sense amp block 222, the switching block 244 connects the memory cell block 212 with the sense amp block 223, the switching block 245 connects the memory cell block 213 with the sense amp block 223, the switching block 246 connects the memory cell block 213 with the sense amp block 224, the switching block 247 connects the memory cell block 214 with the sense amp block 224, and the switching block 248 connects the memory cell block 214 with the sense amp block 225. The switching block 241 and the switching block 242 are turned on/turned off by the control signal BIS1 of the controller 271, the switching block 243 and the switching block 244 are turned on/turned off by the control signal BIS2 of the controller 272, the switching block 245 and the switching block 246 are turned on/turned off by the control signal BIS3 of the controller 273, and the switching block 247 and the switching block 248 are turned on/turned off by the control signal BIS4 of the controller 274. Further, the memory cell block 211, the sense amp block 221 and the switching block 241 are connected by the bit lines BL1, /BL1, BL3 and /BL3. The memory cell block 211, the switching block 242, the sense amp block 222, the switching block 243, and the memory cell block 212 are connected by the bit lines BL2, /BL2, BL4 and /BL4. The memory cell block 212, the switching block 244, the sense amp block 223, the switching block 245, and the memory cell block 213 are connected by the bit lines BL1, /BL1, BL3 and /BL3. The memory cell block 213, the switching block 246, the sense amp block 224, the switching block 247, and the memory cell block 214 are connected by the bit lines BL2, /BL2, BL4 and /BL4. The memory cell block 214, the switching block 248 and the memory cell block 225 are connected by the bit lines BL1, /BL1, BL3 and /BL3.

The controllers 271 to 274 receive the enable signal ACT to output the control signals BIS1 to BIS4, respectively. The outputted control signal BIS1 is inverted through an inverter IN1 and transferred to the switching blocks 241 and 242. The outputted control signal BIS2 is inverted through an inverter IN2 and transferred to the switching blocks 243 and 244. The outputted control signal BIS3 is inverted through an inverter IN3 and transferred to the switching blocks 245 and 246. The outputted control signal BIS4 is inverted through an inverter IN4 and transferred to the switching blocks 247 and 248.

Hereinafter, cases where the memory device is in an operation mode and a waiting mode will be separately described.

When the memory device is in the operation mode, in order to designate matrix type memory cells, row addresses and column addresses are applied to the memory cells through the word lines WL1 to WL4 and the bit lines BL1, /BL1, BL2, /BL2, BL3, /BL3, BL4, and /BL4. Simultaneously, the enable signal ACT is applied to the controller 271 to 274. Then, the controller 271 applies the control signal BIS1 to the switching blocks 241 and 242, the controller 272 applies the control signal BIS2 to the switching blocks 243 and 244, the controller 273 applies the control signal BIS3 to the switching blocks 245 and 246, and the controller 274 applies the control signal BIS4 to the switching blocks 247 and 248. For example, when one memory cell block 212 is selected from the four memory cell blocks 211 to 214, only the control signal BIS2 comes into a low level from among the four control signals BIS1, BIS2, BIS3 and BIS4. The control signal BIS2 is inverted by the inverter IN2 and is applied to the switching blocks 243 and 244. As a result, only the two switching blocks 243 and 244 are turned on from among the eight switching blocks 241 to 248. Therefore, the sense amp blocks 222 and 223 are connected to the memory cell block 212 to be selected. The sense amps 228 and 229 of the connected sense amp block 222 and the sense amps 230 and 231 of the connected sense amp block 223 detect data of the memory cells in the memory cell block 212, respectively. As described above, the sense amp block described in the present invention includes an equalizer for precharging corresponding pairs of bit lines with precharge voltage. As known in the art, the equalizer is a circuit for precharging pairs of bit lines with precharge voltage in a precharge mode.

When the memory device is in the waiting mode, each of the word lines WL1 to WL4 maintains a ground level, i.e., a Vss level. The controller 271 outputs the control signal BIS1 of a high level by the enable signal ACT, the controller 272 outputs the control signal BIS2 of a high level by the enable signal ACT, the controller 273 outputs the control signal BIS3 of a high level by the enable signal ACT, and the controller 274 outputs the control signal BIS4 of a high level by the enable signal ACT. The control signal BIS1 is inverted by the inverter IN1 and is applied to the switching blocks 241 and 242, the control signal BIS2 is inverted by the inverter IN2 and is applied to the switching blocks 243 and 244, the control signal BIS3 is inverted by the inverter IN3 and is applied to the switching blocks 245 and 246. and the control signal BIS4 is inverted by the inverter IN4 and is applied to the switching blocks 247 and 248. As a result, all of the switching blocks 241 to 248 are turned off. That is, the memory cell blocks 211 to 214 and the sense amp blocks 221 to 225 are turned off, respectively, so that the sense amp block and the memory cell block are separated. Consequently, the equalizer in the sense amp block does not have influence on the memory cell block. That is, because the bit lines of the memory cell block are separated from the sense amp block, the bit lines comes into a state where they are not influenced by the equalizer in the sense amp block. As a result, the bit lines have ground voltage. Consequently, leakage current does not flow even when a bridge is formed between a bit line and a word line corresponding to the bit line. In other words, even when a bridge 281 is formed between the bit line WL2 and the word line BL3, current does not flow because the switching block 244 is in the turn-off state.

Hereinafter, the superiority of the memory device according to the present invention will be described through comparison of a conventional memory device and the memory device of the present invention.

As described above, when the conventional memory device is in a waiting mode, a switching block is turned on. Therefore, when a bridge is formed between a word line and a bit line, leakage current flows by voltage difference between the word line and the bit line, so that power is consumed.

However, when the memory device of the present invention is in a waiting mode, a switching block is turned off. Therefore, even when a bridge is formed between a word line and a bit line, leakage current does not flow by the switching block turned off. Accordingly, power consumption does not occur.

As described above, when the memory device according to the present invention is used, leakage current does not flow in the waiting mode of the memory device even when a bridge is formed between a word line and a bit line. As a result, power consumption can be reduced.

The preferred embodiment of the present invention has been described for illustrative purposes, and those skilled in the art will appreciate that various modifications, additions and substitutions are possible, without departing from the scope and spirit of the invention as disclosed in the accompanying claims.

What is claimed is:

1. A memory device for reducing leakage current, the memory device comprising:

N memory cell blocks each of which includes plurality of memory cell blocks, wherein N represents a natural number;

(N+1) sense amp blocks corresponding to the N memory cell blocks;

2N switching blocks connecting the N memory cell blocks to the (N+1) sense amp blocks, respectively;

N controllers for controlling the 2N switching blocks, respectively, each of the controllers having an output; and N inverters, each inverter of the N inverters having an input coupled to the output of a corresponding one of the N controllers, each inverter of the N inverters having an output that is coupled to a corresponding pair of the 2N switching blocks;

wherein an output signal from each of the N controllers is inverted by a corresponding inverter, and wherein said inverted signal from a controller turns off the 2N switching blocks when the memory device is in a waiting mode, and the N controllers selectively turn on the 2N switching blocks when the memory device is in an operation mode.

2. The memory device as claimed in claim 1, wherein N word lines connect the memory cells with each other, the N word lines corresponding to the N memory cell blocks respectively, bit lines corresponding to the memory cells connect the N memory cell blocks, the 2N switching blocks and the (N+1) sense amp blocks with each other, and a random $i^{th}$ controller of the N controllers is connected to a $(2i-1)^{th}$ switching block and a 2i.sup.th switching block of the 2N switching blocks, wherein i represents a constant having a value of 1, 2, . . . , N.

3. The memory device as claimed in claim 1, wherein both a $(2k-1)^{th}$ switching block and a $2k^{th}$ switching block of the 2N switching blocks are turned on by an $k^{th}$ controller of the N controllers when the memory device is in an operation mode for selecting an $k^{th}$ memory cell block of the N memory cell blocks, wherein k represents a constant having a value of 1, 2, . . . , N.

4. A memory device having a folded bit line structure, the memory device comprising:

N memory cell blocks; and a first switching block, a sense amp block and a second switching block disposed every between the memory cell blocks, wherein the first switching block is located between an $i^{th}$ memory cell block and the sense amp block, the second switching block is located between an $(i-1)^{th}$ memory cell block and the sense amp block, the first switching block and the second switching block are turned off by a signal from an inverter, said inverter receiving a signal from a controller when the memory device is in a waiting mode, and only the first switching block adjacent to the $i^{th}$ memory cell block is turned on when the memory device is in an operation mode.

5. The memory device as claimed in claim 4, wherein when the memory device is in a waiting mode, bit lines of the memory cell block maintain ground voltage.

* * * * *